United States Patent
Zhang

(10) Patent No.: US 7,677,912 B2
(45) Date of Patent: Mar. 16, 2010

(54) ELECTRICAL CONNECTOR HAVING STIFFENER WITH ELASTIC LATCHES

(75) Inventor: Jie-Feng Zhang, Shenzhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/506,451

(22) Filed: Jul. 21, 2009

(65) Prior Publication Data
US 2010/0015837 A1    Jan. 21, 2010

(30) Foreign Application Priority Data
Jul. 21, 2008   (CN) .................... 2008 2 0301555

(51) Int. Cl.
*H01R 13/62* (2006.01)
(52) U.S. Cl. .................................... 439/331
(58) Field of Classification Search ............. 439/331, 439/342
See application file for complete search history.

(56) References Cited

U.S. PATENT DOCUMENTS

| 6,685,494 | B1 * | 2/2004 | McHugh et al. ............. 439/342 |
| 6,877,990 | B2   | 4/2005 | Liao |
| 7,059,885 | B2   | 6/2006 | Szu |
| 7,234,955 | B1 * | 6/2007 | Ho ............................. 439/331 |
| 2008/0045048 | A1 * | 2/2008 | Ma ............................. 439/73 |

FOREIGN PATENT DOCUMENTS

CN          201041842          3/2008

* cited by examiner

*Primary Examiner*—Phuong K Dinh
(74) *Attorney, Agent, or Firm*—Andrew C. Cheng; Wei Te Chung; Ming Chieh Chang

(57) ABSTRACT

An electrical connector for electrically connecting an IC package to a printed circuit board is provided, which includes an insulative housing including a main body for supporting the IC package and four straight peripheral sidewalls surrounding the main body; a stiffener having a base separably disposed around the insulative housing. The base defines an opening for receiving the insulative housing. And the stiffener further includes four elastic latches extending upwardly from inner sides of the opening for engaging with the insulative housing, and the insulative housing corresponding defines four slots on outside surfaces of the sidewalls for being resisting against the elastic latches.

9 Claims, 6 Drawing Sheets

ELECTRICAL CONNECTOR HAVING STIFFENER WITH ELASTIC LATCHES

BACKGROUND OF THE INVENTION

1. Field of the Invention

The present invention generally relates to the art of electrical connectors, and more particularly, to an electrical connector having a stiffener with elastic latches to removeably retain an electrical connector therein and provide a good electrical connection between an IC package and an electrical substrate, such as a printed circuit board (PCB).

2. Background of the Invention

Electrical connectors for mounting the IC package to the printed circuit board are widely used in electrical equipments. The conventional electrical connector such as disclosed in U.S. Pat. Nos. 6,877,990 and 7,059,885, issued to Liao on Apr. 12, 2005, and Szu on Jun. 13, 2006, respectively, typically comprises an insulative housing, a stiffener partially surrounding the insulative housing, a load plate pivotally engaged with one end of the stiffener, and a lever engaged with the other end of the stiffener for fastening the load plate onto the insulative housing. The IC package is sandwiched between the load plate and the insulative housing. The insulative housing usually defines an opening adapted for receiving the IC package. The insulative housing has some ribs at lateral sidewalls to engage with inner edge of the stiffener when the electrical connector is disposed therein.

Referring to FIG. 1, Chinese Utility Pat. No. 201041842 issued to Yu on Mar. 26, 2008, discloses a conventional electrical connector 1'. The electrical connector 1' comprises an insulative housing 2', a plurality of contacts 6' received in the insulative housing 2', a stiffener 3' surrounding the insulative housing 2', a load plate 4' pivotally engaged with one end of the stiffener 3', and a lever 5' engaged with the other end of the stiffener 3' for fastening the load plate 4' onto the insulative housing 2'. The insulative housing 2' has some ribs 23' extending from lateral sidewalls thereof. The hollow stiffener 3' is provided with a large central rectangular through-hole 31, which is adapted for receiving the insulative housing 2' therein. In assembly of the electrical connector 1', the ribs 23' engage with inner sidewalls 32' of the hollow stiffener 3' so as to assemble the insulative housing 2' in the stiffener 3'. Then an IC package (not shown) is seated on the insulative housing 2' and the load plate 4' is rotated to a horizontal close position and locked by the lever. Thus it can realize an electrical connection between the IC package (not shown) and a printed circuit board (not shown) via the electrical connector 1'.

However, in the above-mentioned electrical connector 1', the stiffener 3' usually is stamped from a metal sheet and so the inner sidewalls 32' are edgy. When the ribs 23' of the insulative housing 2' engage with the inner sidewalls 23', the insulative housing 2' is easily scraped or even damaged in worst case. If this happens, it will reduce an interferential force between the insulative housing 2' and the stiffener 3', and so the insulative housing 2' will rock with respect to the stiffener. Thus it would affect the normal electrical connection of the electrical connector 1'.

In view of the above, a new electrical connector which overcomes the above-mentioned disadvantages is desired.

SUMMARY OF THE INVENTION

An object of the invention is to provide an electrical connector having a stiffener with elastic latches for engaging with an insulative housing so as to firmly hold the insulative housing on the stiffener.

In accordance with the present invention, an electrical connector for electrically connecting an IC package to a printed circuit board is provided, which includes an insulative housing including a main body for supporting the IC package and four straight peripheral sidewalls surrounding the main body; a stiffener having a base separably disposed around the insulative housing. The base defines an opening for receiving the insulative housing. And the stiffener further includes four elastic latches extending upwardly from inner side of the opening for engaging with the insulative housing, and the insulative housing corresponding defines four slots on outside surface of the sidewall for resisting against the elastic latches.

Other features and advantages of the present invention will become more apparent to those skilled in the art upon examination of the following drawings and detailed description of preferred embodiment, in which:

DETAILED DESCRIPTION OF THE PREFERRED EMBODIMENT

Figure 1:
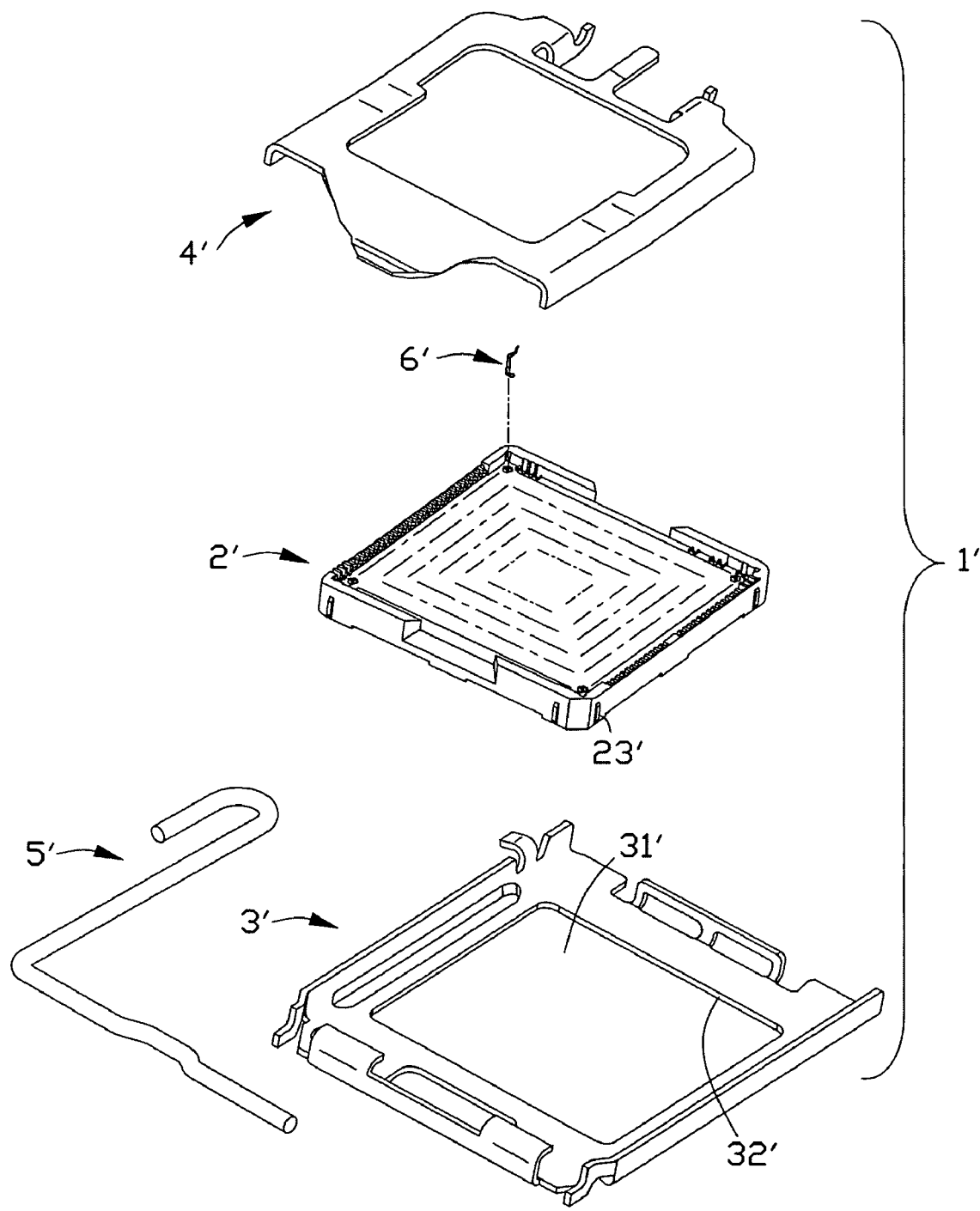
FIG. 1 depicts an exploded isometric view of a conventional electrical connector.
Figure 2:
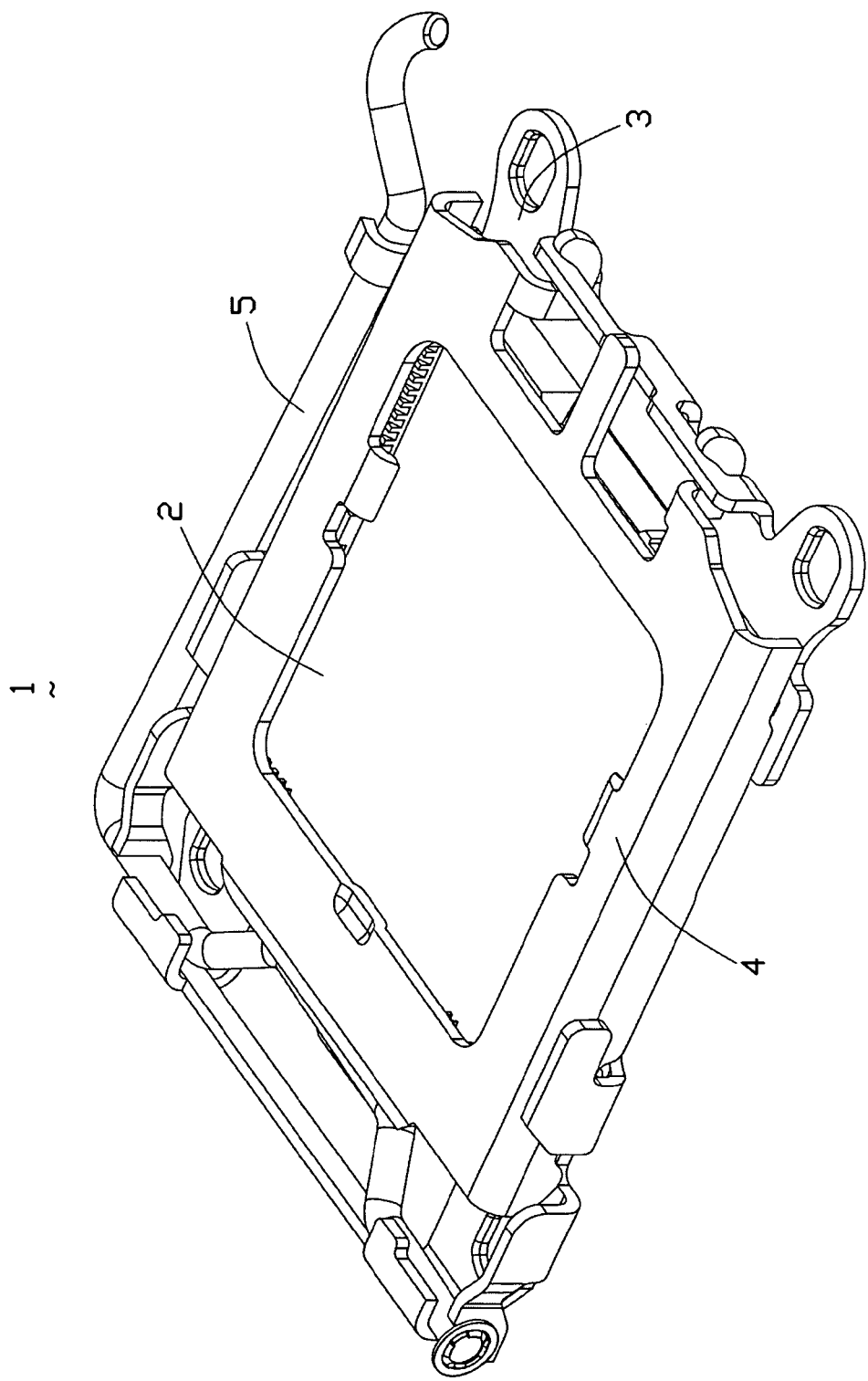
FIG. 2 depicts an assembled, isometric view of an electrical connector in accordance with a preferred embodiment of the present invention.

Reference will now be made to describe the preferred embodiment of the present invention in detail.

As shown in FIG. 2 to FIG. 6, an electrical connector 1 in accordance with a preferred embodiment of the present invention is used to establish electrical connection between an IC package (not shown) and an electrical substrate, such as a PCB (not shown). The electrical connector 1 includes an insulative housing 2 assembled with a plurality of terminals (not shown), a stiffener 3 surrounding the insulative housing 2, a load plate 4 pivotally mounted on one end of the stiffener 3, and a load lever 5 pivotally supported on an opposite end of the stiffener 3.

Figure 3:
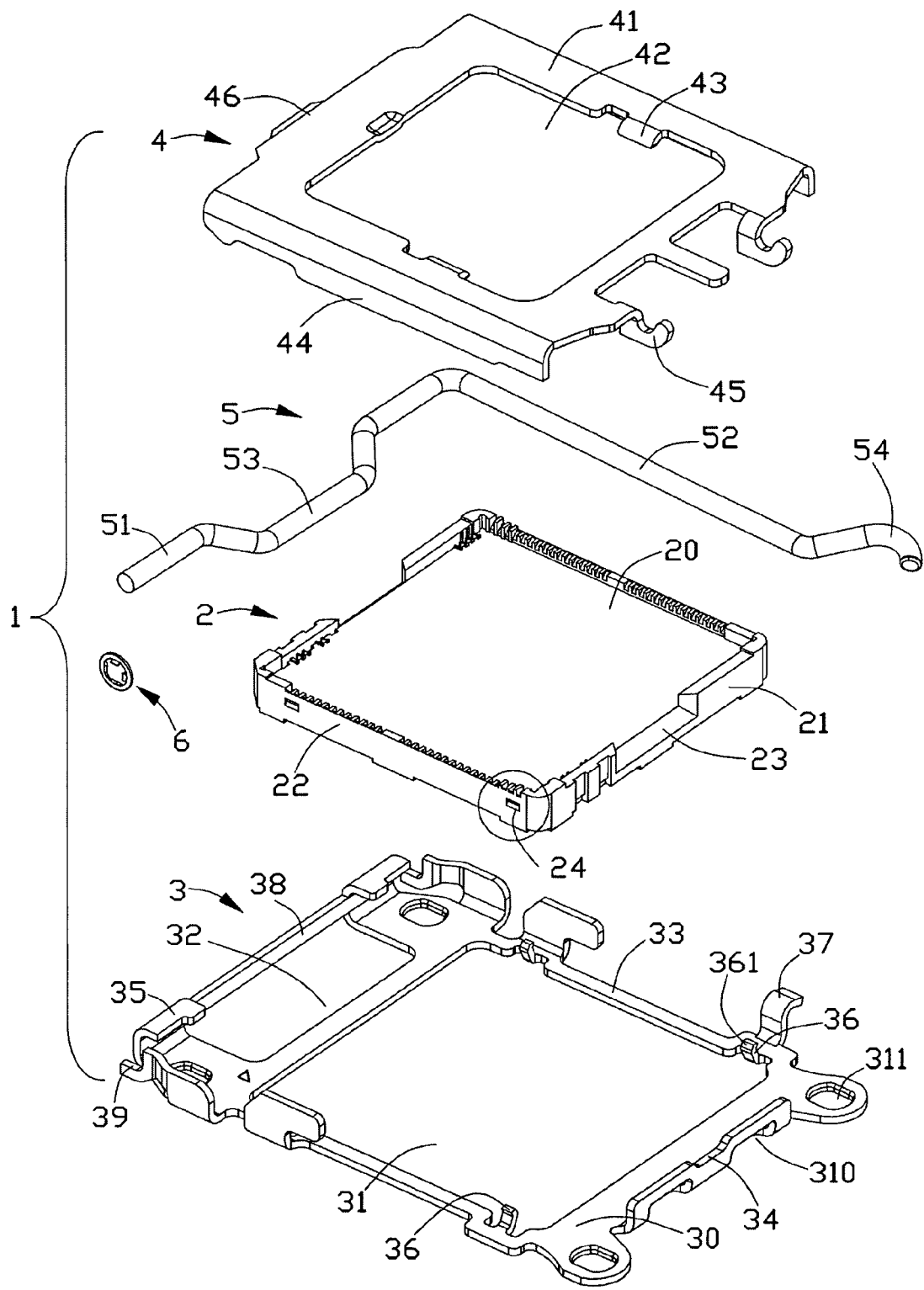
FIG. 3 depicts an exploded, isometric view of an electrical connector in accordance with a preferred embodiment of the present invention.
Figure 4:
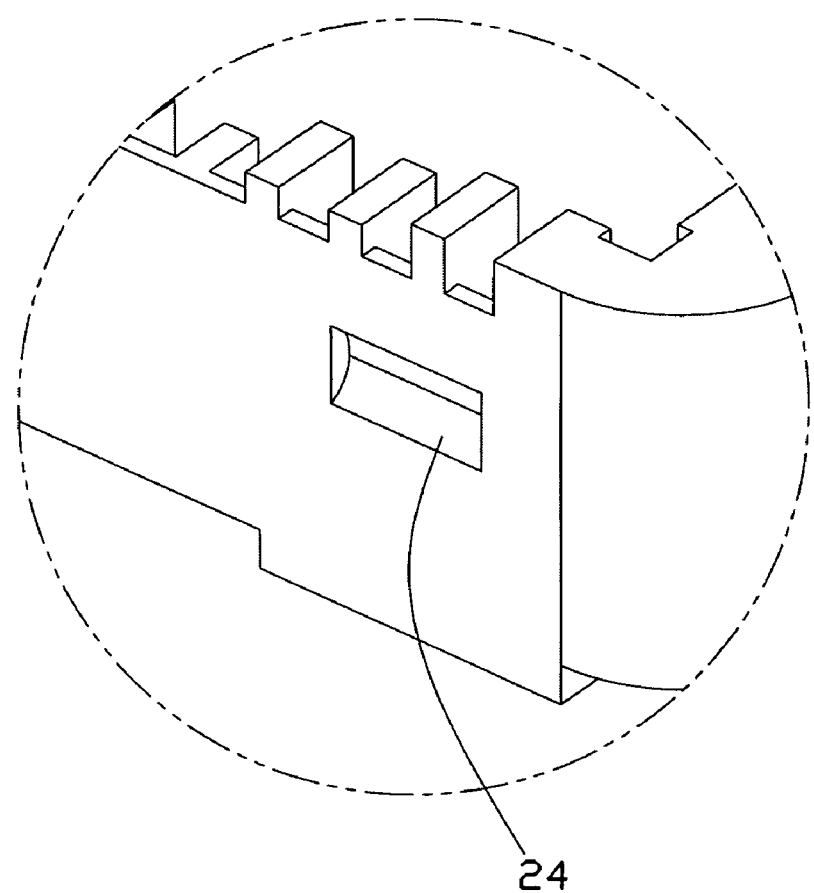
FIG. 4 depicts an enlarged view of a circled part shown in FIG. 3.
Figure 5:
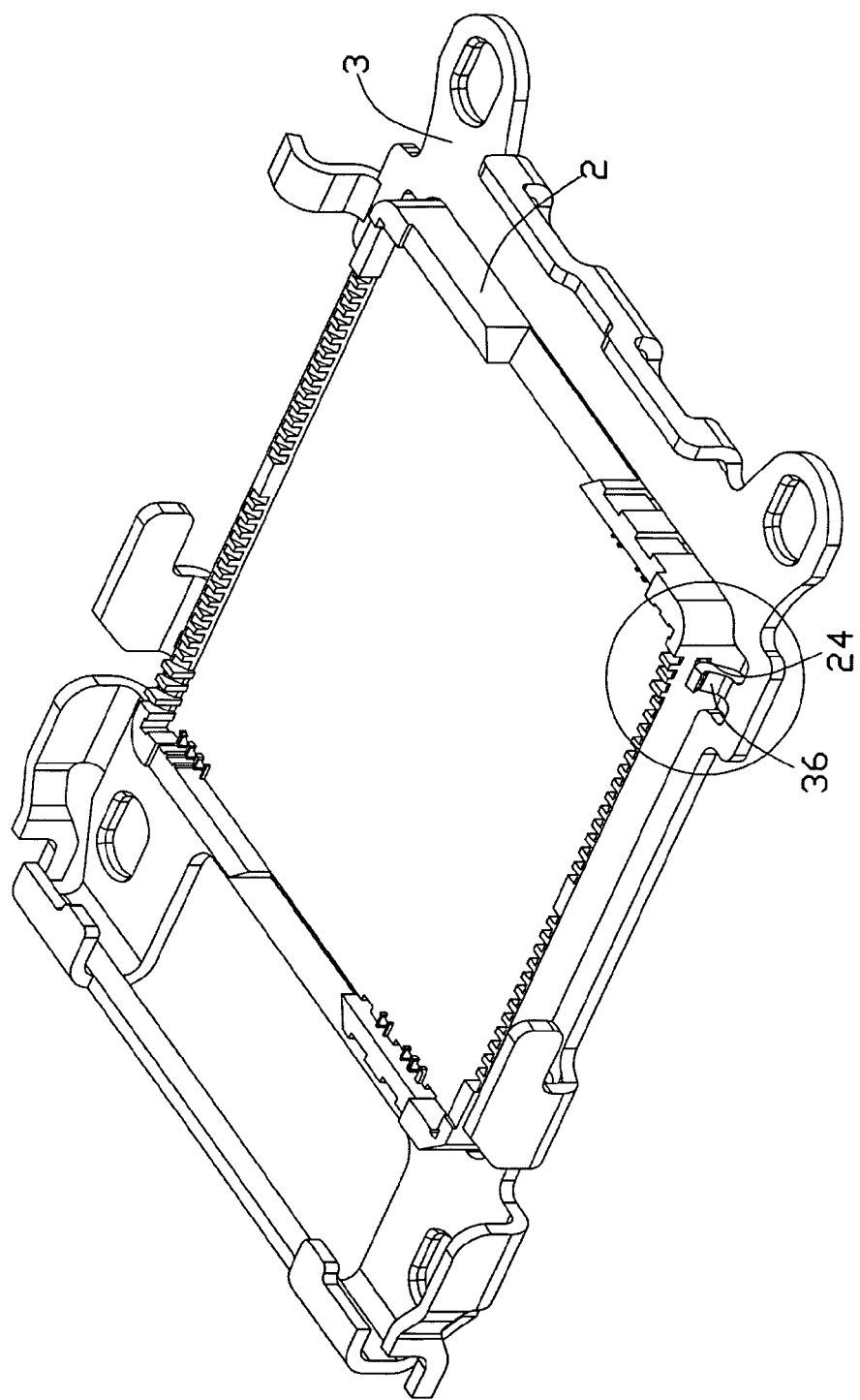
FIG. 5 depicts an partially assembled, isometric view of the electrical connector in accordance with a preferred embodiment of the present invention.
Figure 6:
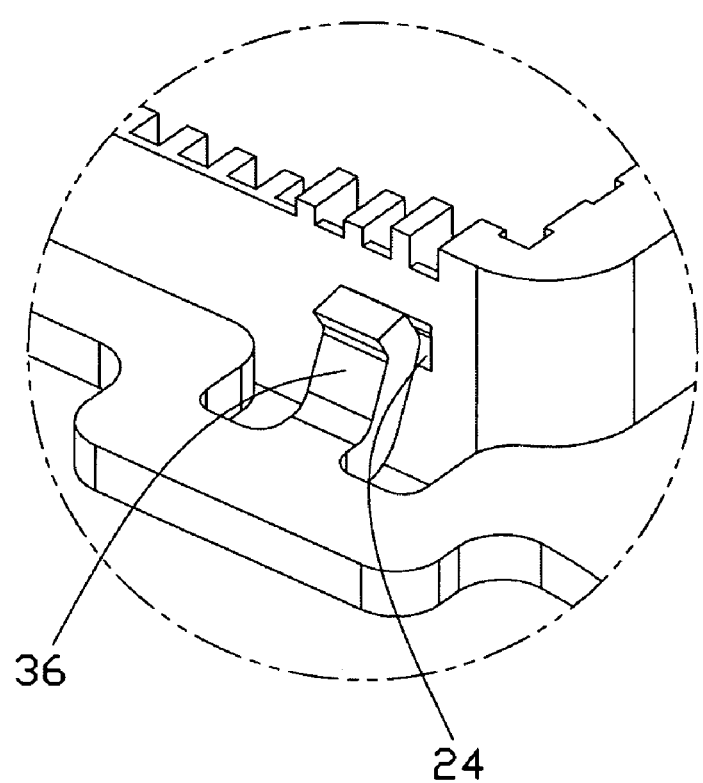
FIG. 6 depicts an enlarged view of a circled part shown in FIG. 5.

As shown in FIG. 3 and FIG. 4, the insulative housing 2 is made of insulative material. The insulative housing 2 includes a main body 20 for receiving the terminals (not shown) and four straight peripheral sidewalls 21 surrounding the main body 20. A first pair of opposite parallel sidewalls 21 each defines cutouts 23 at middle position for conveniently taking out the IC package (not shown). Another pair of opposite parallel sidewalls 22 each defines slots 24 at exterior surface thereof. The slots 24 are symmetrically located on two ends of the sidewall 22. Each slot 24 is formed in a curved structure.

The stiffener 3 is stamped from a metal sheet into a rectangular plate. The stiffener 3 comprises a base 30, a front sidewall 34 extending upwardly from one end of the base 30 for attaching the load plate 4, a back sidewall 38 extending upwardly from an opposite end of the base 30 for attaching the load level 5 and a pair of parallel lateral sides 33 connecting the front sidewall 34 and the back sidewall 38. The base 30 defines an opening 31 in the middle thereof for receiving the insulative housing 2 and a receiving recess 32 adjacent to the back sidewall 38 for receiving a part of the load plate 4 therein. The front sidewall 34 defines a pair of separate retaining grooves 310 for connecting the load plate 4. The back sidewall 38 includes a pair of U-shaped cross-sections 35 extending toward the receiving recess 32. Each lateral side 33 defines a substantially L-shaped stopper wall 39 extending toward the back sidewall 38. One of the lateral sides 33 defines a locking hook 37 for engaging with load lever 5.

In additional, the base 30 defines four circular through holes 311 at the corner of the stiffener 3 for fasteners (not shown) passing through. The through holes 311 are situated at outside of the load plate 3 when the load plate 3 is positioned in a closed position. The stiffener 3 further includes four elastic latches 36 extending upwardly from the inner side of the opening 31 of the base 30. The elastic latches 36 are symmetrically located on two ends of each lateral side 33 corresponding to the slots 24 of the insulative housing 2. Each elastic latch 36 includes a guiding slant surface 361 at a top end thereof so that the elastic latch 36 can readily slide into the slot 24 to hold the insulative housing 2 firmly in the stiffener 3.

The load plate 4 is also stamped from a metal sheet and configured into a generally rectangular hollow frame. The load plate 4 includes a main portion 41. The main portion 41 defines a window 42 at middle thereof. A pair of pressing portions 43 extend downwardly from inner sides of the window 42. The main portion 41 includes a pair of lateral sides 44 extending downwardly from outsides thereof. A pair of bearing tongues 45 are formed on one end of the main portion 41 corresponding to the retaining grooves 310 of the stiffener 3 for connecting the load plate 4 on the stiffener 3. The bearing tongues 45 are curved downward and spaced apart from one another. An interlocking portion 46 for engaging with the load lever 5 is formed at a middle section of another end of the main portion 41. The interlocking portion 46 projects downwardly and extends in an outward direction.

The load lever 5 is substantially L-shape and is rotatably coupled to the stiffener 3. The load level 5 includes a driving portion 52 and a shaft portions 51 perpendicularly extending from one end of the driving portion 52. The driving portion 52 defines an operating handle 53 extending outwardly at the other end thereof. The load level 5 includes a latching section 53 that is positioned between the pair of shaft portions 51. A ring 6 is assembled on a free end of the shaft portion 51 for limiting the excessively movement of the load level 5.

Assembling the electrical connector 1, the load plate 4 and the load level 5 are respectively pivotally assembled on the front sidewall 34 and the back sidewall 38 of the stiffener 3. Then make the load plate 4 and the load level 5 in an opened position and put the insulative housing 2 in the central opening 31 of the stiffener 3. And the elastic latches 36 push against the slots 24 of the insulative housing 2, so the insulative housing 2 is fastened in the stiffener 3.

The electrical connector 1 can be fastened on the printed circuit board (not shown) by the fastener (not shown), such as screw. When the driving portion 52 of the load lever 5 is released so that the latching section 53 is disengaged from the interlocking portion 46 of the load plate 4, and the load plate 4 is positioned in the opened position. Put the IC package (not shown) on the insulative housing 2. The load plate 4 is then pivoted to the closed position and is locked by the latching section 53 of the load lever 5. The driving portion 52 is driven to be lower than the latching section 53, which presses downwardly on the load plate 4. When the load plate 4 is in the closed position, the conductive pads (not shown) of the IC package are brought into contact with terminals (not shown) embedded in the insulative housing 2.

The stiffener 3 of the electrical connector 1 includes four elastic latches 36 engaging with the slots 24 of the insulative housing 2 and thus it can reach a good assembling of the insulative housing 2 in the opening 31 of the stiffener 3. Additionally, it can avoid the stiffener 3 to scrape the insulative housing 2, and burrs of the insulative housing 2 will not produce. Thus it can realize a good electrical connection of the electrical connector 1.

It should be noted that the number of the elastic latches 36 of the stiffener 3 and the number of the slots 24 of the insulative housing 2 can be changed. And the elastic latches 36 can extend upwardly from any position of the inner side of the opening 31 of the stiffener 3 and the position of the slots 24 of the insulative housing 2 can change correspondingly.

While the present invention has been described with reference to a specific embodiment, the description of the invention is illustrative and is not to be construed as limiting the invention. Various of modifications to the present invention can be made to the preferred embodiment by those skilled in the art without departing from the true spirit and scope of the invention as defined by the appended claims.

What is claimed is:

1. An electrical connector for electrically connecting an IC package to a printed circuit board comprising:
   an insulative housing including a main body for supporting the IC package and four straight peripheral sidewalls surrounding the main body;
   a stiffener having a base separably disposed around the insulative housing, the base defining an opening to receive the insulative housing, the stiffener further including at least one elastic latch extending upwardly from an inner side of the opening to removeably retain the electrical connector therein;
   a load plate pivotally mounted on one end of the stiffener, the load plate being pivotal between an open position and a closed position where the load plate pressing the IC package toward the insulative housing; and
   a load lever pivotally supported on the other end of the stiffener for locking the load plate in the closed position, wherein the insulative housing correspondingly defines at least one slot on an outside surface of the sidewalls for resisting against the elastic latch, wherein the stiffener provides four elastic latches extending upwardly from two opposite inner sides of the opening, and the insulative housing correspondingly defines four slots on outside surfaces of the sidewalls, wherein the four elastic latches are symmetrically located on two ends of the inner sides of the opening in longitudinal direction, wherein each elastic latch includes a guiding slant surface on a top end thereof for easily abutting against the slot of the insulative housing.

2. The electrical connector as claimed in claim 1, wherein the base defines four circular through holes at the corner of the stiffener for fastening the electrical connector on the printed circuit board.

3. The electrical connector as claimed in claim 2, wherein the through holes are situated outside of the load plate when the load plate is positioned in a closed position.

4. The electrical connector as claimed in claim 1, wherein the stiffener comprises a front sidewall extending upwardly from one end of the base for attaching the load plate, a back sidewall extending upwardly from an opposite end of the base for attaching the load level, and a pair of parallel lateral sides connecting the front sidewall and the back sidewall.

5. The electrical connector as claimed in claim 1, wherein the front sidewall defines a pair of separate retaining grooves for connecting the load plate, and the back sidewall includes a pair of U-shaped cross-sections for joining the load level.

6. The electrical connector as claimed in claim 5, wherein the load plate includes a main portion having a window at the middle thereof.

7. The electrical connector as claimed in claim 6, wherein a pair of bearing tongues are formed on one end of the main portion corresponding to the retaining grooves of the stiffener for connecting the load plate on the stiffener.

8. The electrical connector as claimed in claim 7, wherein the pair of bearing tongues are curved downwardly and spaced apart from one another.

9. The electrical connector as claimed in claim 6, wherein an interlocking portion for engaging with the load lever is formed at a middle section of another end of the main portion.

* * * * *